US009838887B2

(12) United States Patent
Niskanen et al.

(10) Patent No.: US 9,838,887 B2
(45) Date of Patent: Dec. 5, 2017

(54) METHODS, APPARATUS AND COMPUTER PROGRAMS FOR OBTAINING DATA

(71) Applicant: Nokia Technologies Oy, Espoo (FI)

(72) Inventors: Antti Niskanen, Cambridge (GB); Joachim Wabnig, Upper Cambourne (GB)

(73) Assignee: Nokia Technologies Oy, Espoo (FI)

( * ) Notice: Subject to any disclaimer, the term of this patent is extended or adjusted under 35 U.S.C. 154(b) by 124 days.

(21) Appl. No.: 14/652,569

(22) PCT Filed: Dec. 17, 2012

(86) PCT No.: PCT/FI2012/051252
§ 371 (c)(1),
(2) Date: Jun. 16, 2015

(87) PCT Pub. No.: WO2014/096501
PCT Pub. Date: Jun. 26, 2014

(65) Prior Publication Data
US 2015/0334580 A1    Nov. 19, 2015

(51) Int. Cl.
*H04L 1/00*    (2006.01)
*G08B 1/08*    (2006.01)
(Continued)

(52) U.S. Cl.
CPC .......... *H04W 24/02* (2013.01); *H03M 7/3062* (2013.01); *H04L 12/12* (2013.01);
(Continued)

(58) Field of Classification Search
CPC ... H04W 24/02; H04W 24/08; H03M 7/3062; H04L 12/40013; H04L 12/12; Y02B 60/34
See application file for complete search history.

(56) References Cited

U.S. PATENT DOCUMENTS 8,516,340 B2    8/2013  Beadle et al.
2005/0243183 A1*  11/2005  Obrador .............. H04N 5/232
                                                    348/222.1
(Continued)

FOREIGN PATENT DOCUMENTS

WO    WO-2011011811 A1    2/2011
WO    WO-2011085368 A1    7/2011
WO    WO-2012034006 A1    3/2012

OTHER PUBLICATIONS

Qaseem, Syed T. et al. "Compressive Sensing for Feedback Reduction in MIMO Broadcast Channels". Retrieved from Internet [Feb. 9, 2013] <http://arxiv.org/pdf/0907.1888v1> Oct. 7, 2009: abstract, p. 3 lines 22-23.
(Continued)

*Primary Examiner* — Kiet Tang
(74) *Attorney, Agent, or Firm* — Mintz Levin Cohn Ferris Glovsky and Popeo, P.C.

(57) ABSTRACT

A system comprising: at least one sensor and at least one control apparatus wherein; the sensor comprises: at least one processor; and at least one memory including computer program code; the at least one memory and the computer program code configured to, with the at least one processor, cause the apparatus at least to perform; compressing a sensor data signal using a sampling basis to obtain a compressed data signal; and in response to a first feedback signal changing a sampling basis used to obtain the compressed data signal; and wherein the control apparatus comprises: at least one processor; and at least one memory including computer program code; the at least one memory and the computer program code configured to, with the at least one processor, cause the apparatus at least to perform; receiving the data signal from the at least one sensor; determining a quality of the received data signal; and if the quality of the received data signal is within a first threshold providing a feedback signal to control the sampling basis of the sensor.

15 Claims, 7 Drawing Sheets

Figure 1:
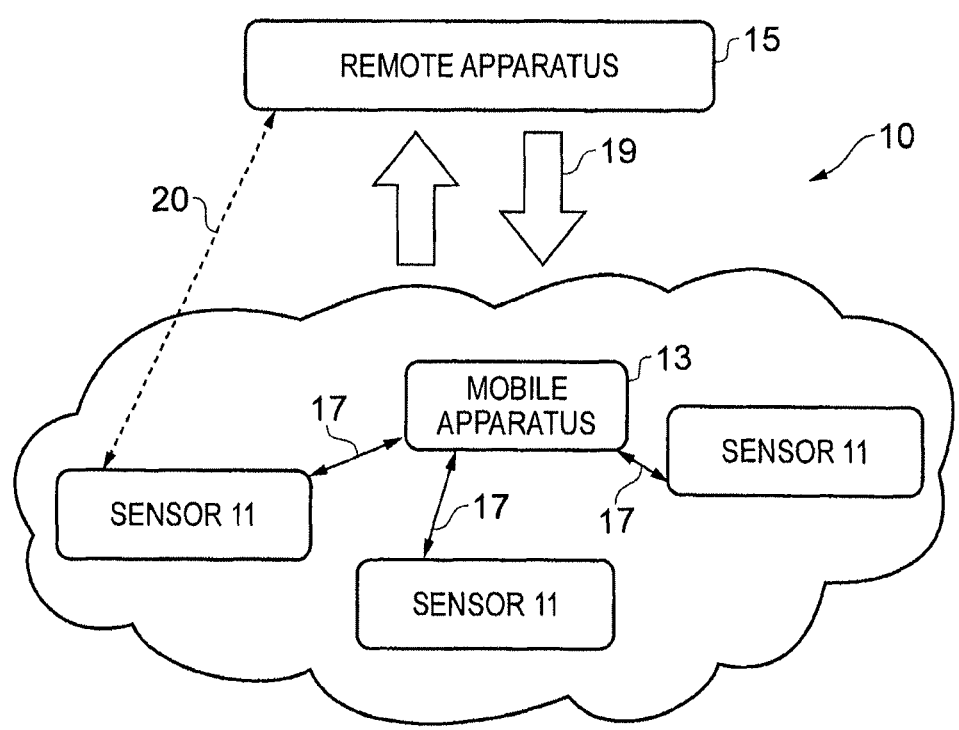

(51) Int. Cl.
*H04N 5/228* (2006.01)
*G11C 29/00* (2006.01)
*H04W 24/02* (2009.01)
*H04W 24/08* (2009.01)
*H04L 12/12* (2006.01)
*H03M 7/30* (2006.01)
*H04L 12/40* (2006.01)

(52) U.S. Cl.
CPC ....... *H04L 12/40013* (2013.01); *H04W 24/08* (2013.01); *Y02B 60/34* (2013.01)

(56) References Cited

U.S. PATENT DOCUMENTS

| | | |
|---|---|---|
| 2007/0078527 A1 | 4/2007 | Gonzalez-Banos et al. |
| 2009/0201150 A1* | 8/2009 | Becker ................... G08C 17/02 340/539.21 |
| 2011/0066381 A1 | 3/2011 | Garudadri et al. |
| 2012/0002564 A1* | 1/2012 | Sexton ................... H03M 7/30 370/252 |
| 2013/0151924 A1* | 6/2013 | Beadle ................... H04L 69/04 714/763 |

OTHER PUBLICATIONS

Kuo, Ping-Heng et al. "Compressive Sensing Based Channel Feedback Protocols for Spatially-Correlated Massive Antenna Arrays". 2012 IEEE Wireless Communications and Networking Conference (WCNC 2012), Paris France, Apr. 1-5, 2012. Retrieved from Internet [Aug. 28, 2013] <http://nrs.harvard.edu/urn-3:HUL.InstRepos:9972705:> abstract.

Donoho, David L. "Compressed sensing." IEEE Transactions on information theory 52.4 (2006): 1289-1306.

* cited by examiner

METHODS, APPARATUS AND COMPUTER PROGRAMS FOR OBTAINING DATA

CROSS-REFERENCE TO RELATED APPLICATION

This application is a national stage application, filed under 35 U.S.C. §371, of PCT Application No. PCT/FI2012/051252, filed on Dec. 17, 2012, the contents of which are incorporated herein by reference in their entirety for all purposes.

TECHNOLOGICAL FIELD

Examples of the disclosure relate to methods, apparatus and computer programs for obtaining data. In particular, they relate to methods, apparatus and computer programs for obtaining data in systems where a plurality of sensors may be located remotely from a control apparatus.

BACKGROUND

Systems comprising sensors located remotely from a processing apparatus are known. Such systems may comprise a plurality of sensors. The sensors may be able to obtain a large amount of information. It is useful to be able to collect the information from the sensors and provide it to the processing apparatus in an efficient manner.

BRIEF SUMMARY

According to various, but not necessarily all, examples of the disclosure there may be provided a method comprising: receiving a data signal from at least one sensor; determining a quality of the received data signal; and if the quality of the received data signal is within a first threshold providing a feedback signal to control a sampling basis of the sensor.

In some examples the method may further comprise, if the quality of the received data signal is within a second threshold, providing a feedback signal to control a sampling density of the sensor.

In some examples the quality of the received data signal which is determined may be the sparsity of the received data signal in a sparse basis.

In some examples the first threshold provides an indication that the received data signal is not sparse in the sparse basis.

In some examples the second threshold may provide an indication that the sparsity of the received data signal has increased.

In some examples the second threshold may provide an indication that the sparsity of the received data signal has decreased.

In some examples the received data signal may comprises a compressed data signal. Compressive sampling may be used to obtain the compressed data signal. The method may further comprise reconstructing the compressed data signal.

In some examples the received data signal may be obtained by sampling a data signal at the highest available density to obtain a high density data signal. The high density data signal may be used to determine the sparse basis.

In some examples the method may comprise receiving a plurality of data signals from a plurality of sensors and determining a quality for each of the plurality of received data signals.

According to various, but not necessarily all, examples of the disclosure there may be provided an apparatus comprising: at least one processor; and at least one memory including computer program code; the at least one memory and the computer program code configured to, with the at least one processor, cause the apparatus at least to perform; receiving a data signal from at least one sensor; determining a quality of the received data signal; and if the quality of the received data signal is within a first threshold providing a feedback signal to control the sampling basis of the sensor.

In some examples there may be provided an apparatus comprising means for performing the method of any of the preceding paragraphs.

According to various, but not necessarily all, examples of the disclosure there may be provided a computer program comprising computer program instructions that, when executed by at least one processor, enable: receiving a data signal from at least one sensor; determining a quality of the received data signal; and if the quality of the received data signal is within a first threshold providing a feedback signal to control a sampling basis of the sensor.

In some examples there may be provided a computer program comprising program instructions for causing a computer to perform the method of any the preceding paragraphs.

In some examples there may be provided a physical entity embodying the computer programs described above.

In some examples there may be provided an electromagnetic carrier signal carrying the computer programs described above.

According to various, but not necessarily all, examples of the disclosure there may be provided a method comprising: compressing a sensor data signal using a sampling basis to obtain a compressed data signal; and in response to a first feedback signal changing a sampling basis used to obtain the compressed data signal.

In some examples the method may further comprise, in response to a second feedback signal, changing a sampling density of the sampling basis used to obtain the compressed data signal.

In some examples the feedback signals may be received from a remote apparatus.

In some examples the method may further comprise transmitting the compressed data signal to a remote apparatus.

In some examples a feedback signal may be received in response to the transmission of the compressed data signal.

In some examples a feedback signal may be received independently of the transmission of the compressed data signal.

According to various, but not necessarily all, examples of the disclosure there may be provided an apparatus comprising: at least one processor; and at least one memory including computer program code; the at least one memory and the computer program code configured to, with the at least one processor, cause the apparatus at least to perform: compressing a sensor data signal using a sampling basis to obtain a compressed data signal; and in response to a first feedback signal changing the sampling basis used to obtain the compressed data signal.

In some examples there may be provided an apparatus comprising means for performing the methods described above.

According to various, but not necessarily all, examples of the disclosure there may be provided a computer program comprising computer program instructions that, when executed by at least one processor, enable: compressing a sensor data signal using a sampling basis to obtain a compressed data signal; and in response to a first feedback signal changing the sampling basis used to obtain the compressed data signal.

In some examples there may be provided a computer program comprising program instructions for causing a computer to perform the methods described above.

In some examples there may be provided a physical entity embodying the computer programs described above.

In some examples there may be provided an electromagnetic carrier signal carrying the computer programs described above.

According to various, but not necessarily all, examples of the disclosure there may be provided a system comprising: at least one sensor and at least one control apparatus wherein; the sensor comprises: at least one processor; and at least one memory including computer program code; the at least one memory and the computer program code configured to, with the at least one processor, cause the apparatus at least to perform; compressing a sensor data signal using a sampling basis to obtain a compressed data signal; and in response to a first feedback signal changing a sampling basis used to obtain the compressed data signal; and wherein the control apparatus comprises: at least one processor; and at least one memory including computer program code; the at least one memory and the computer program code configured to, with the at least one processor, cause the apparatus at least to perform; receiving the data signal from the at least one sensor; determining a quality of the received data signal; and if the quality of the received data signal is within a first threshold providing a feedback signal to control the sampling basis of the sensor.

In some examples the system may comprise a plurality of sensors.

In some examples the sensors may be configured to communicate with the control apparatus via a wireless communication link.

In some examples the system may comprise at least one sensor apparatus as described above and at least one control apparatus as described above.

The apparatus may be for obtaining and/or analysing data.

BRIEF DESCRIPTION

Figure 2:
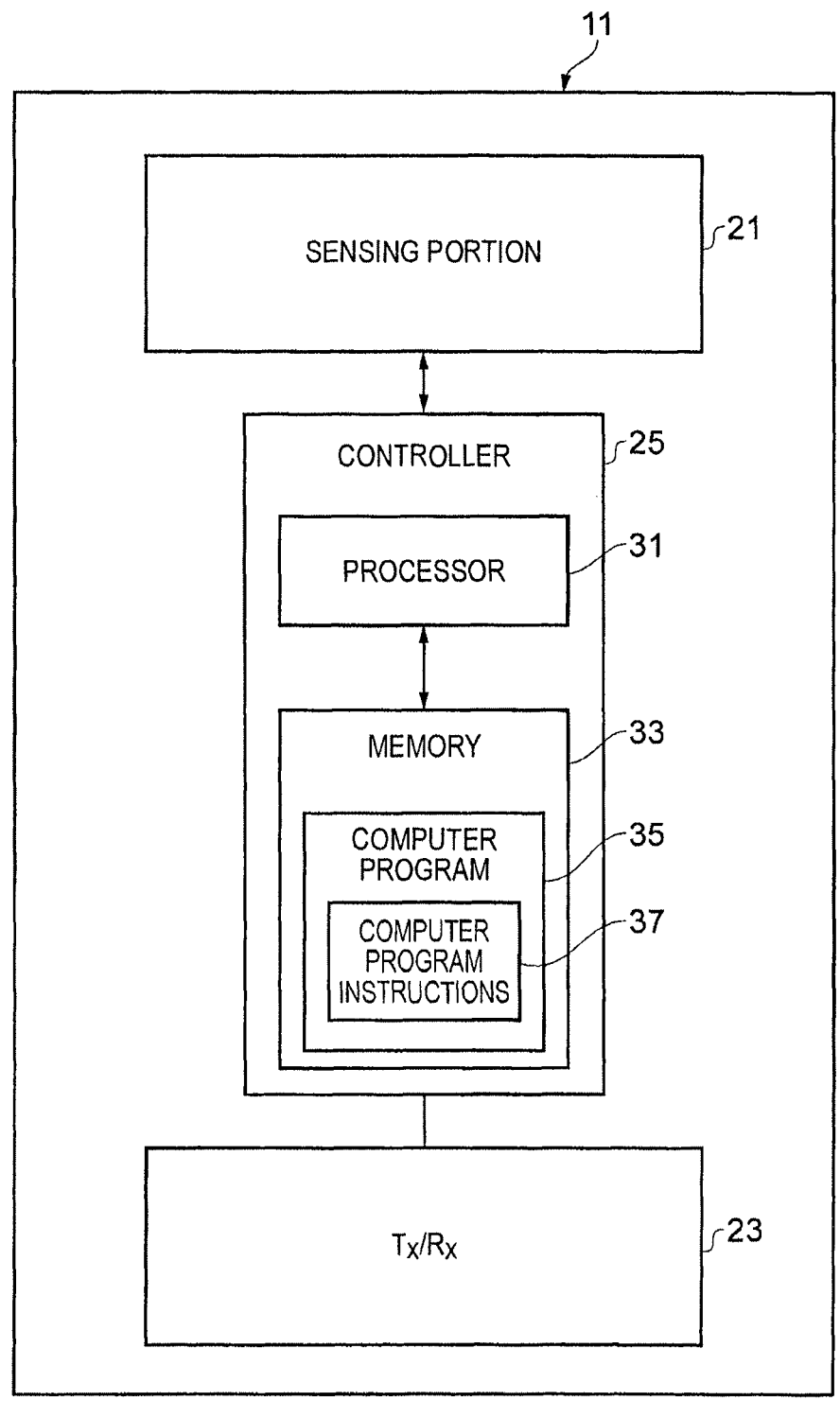
Figure 3:
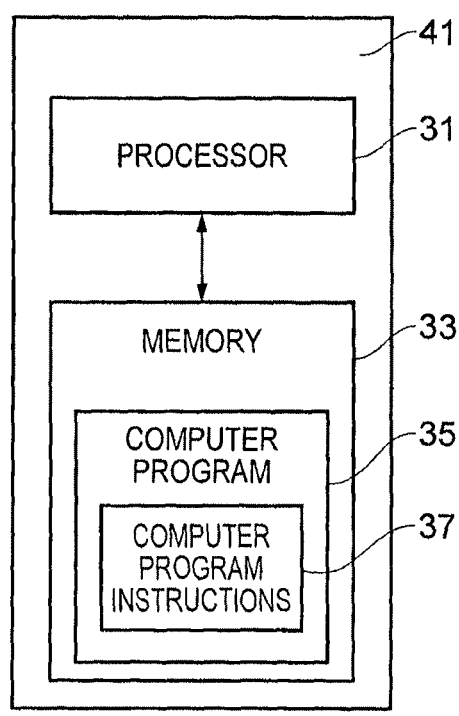
Figure 4:
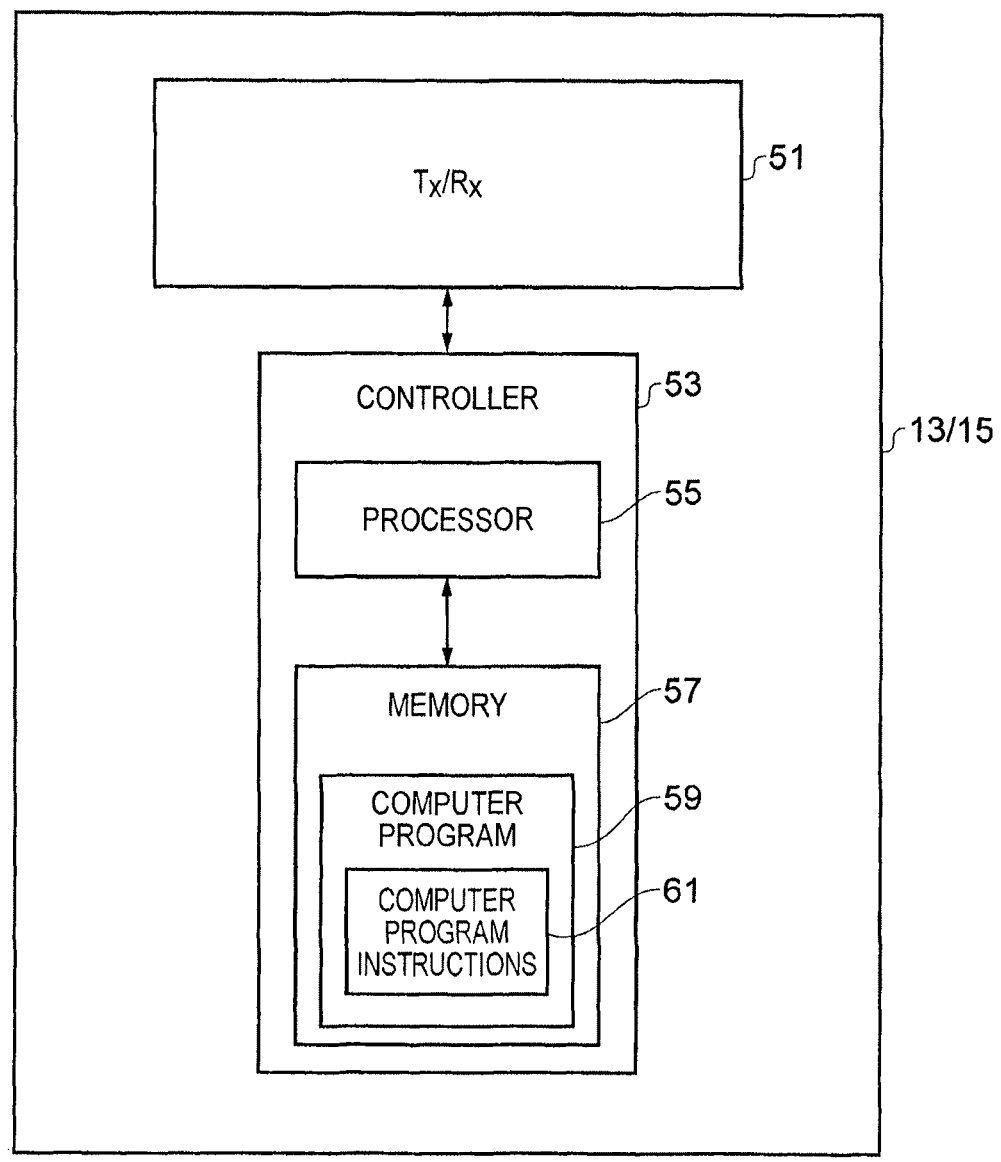
Figure 5:
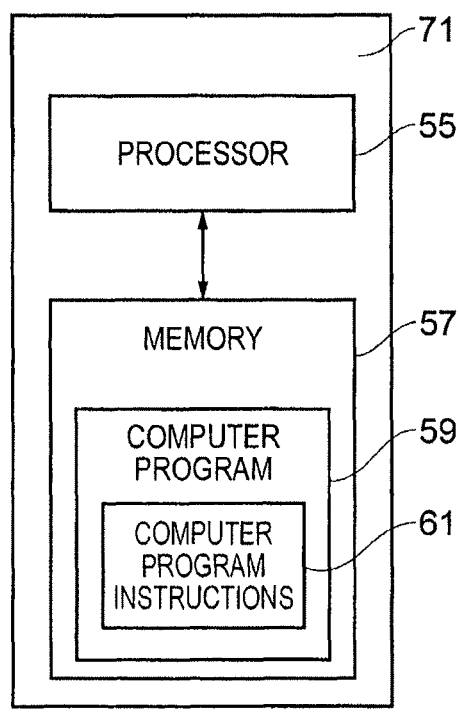
Figure 6:
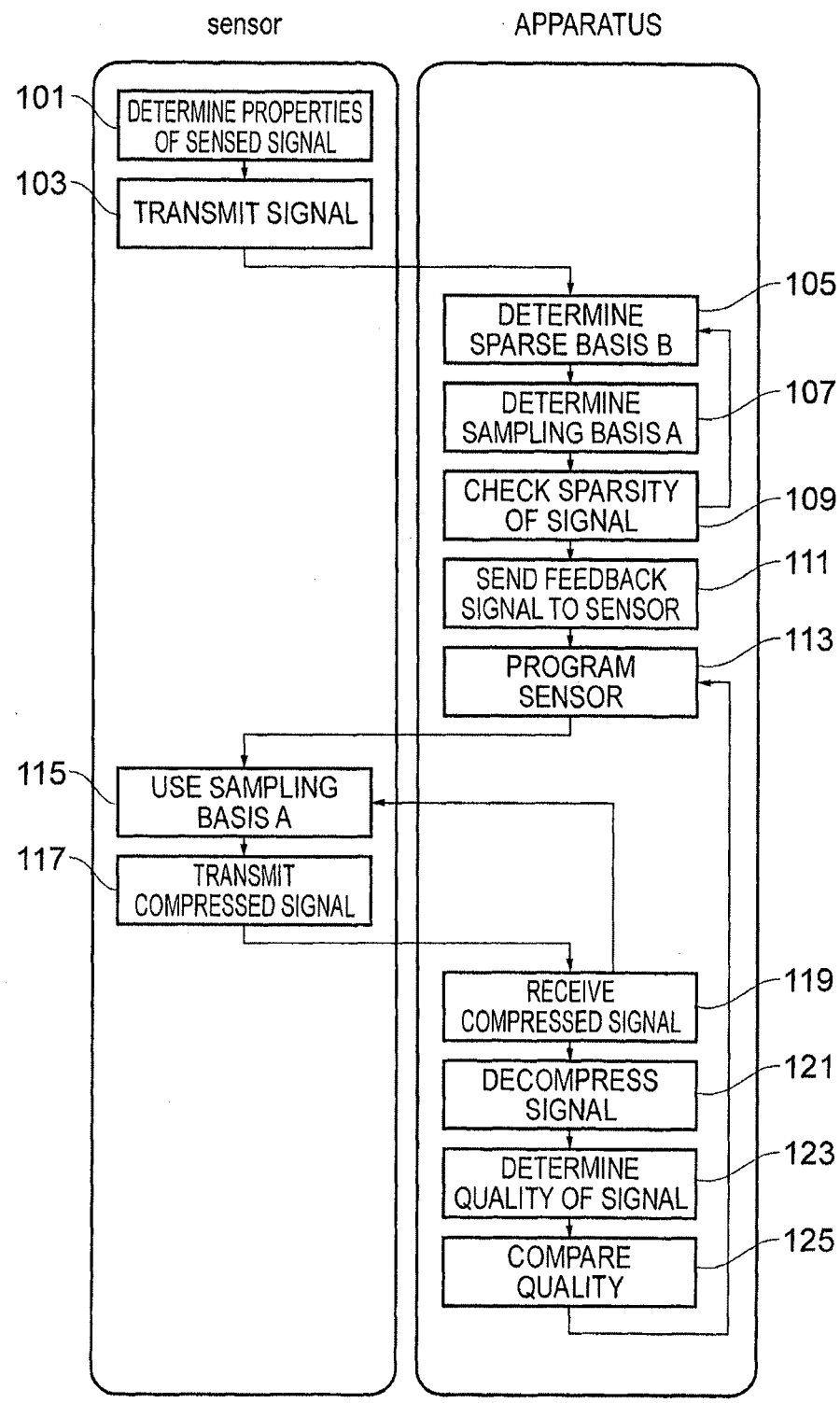
Figure 7:
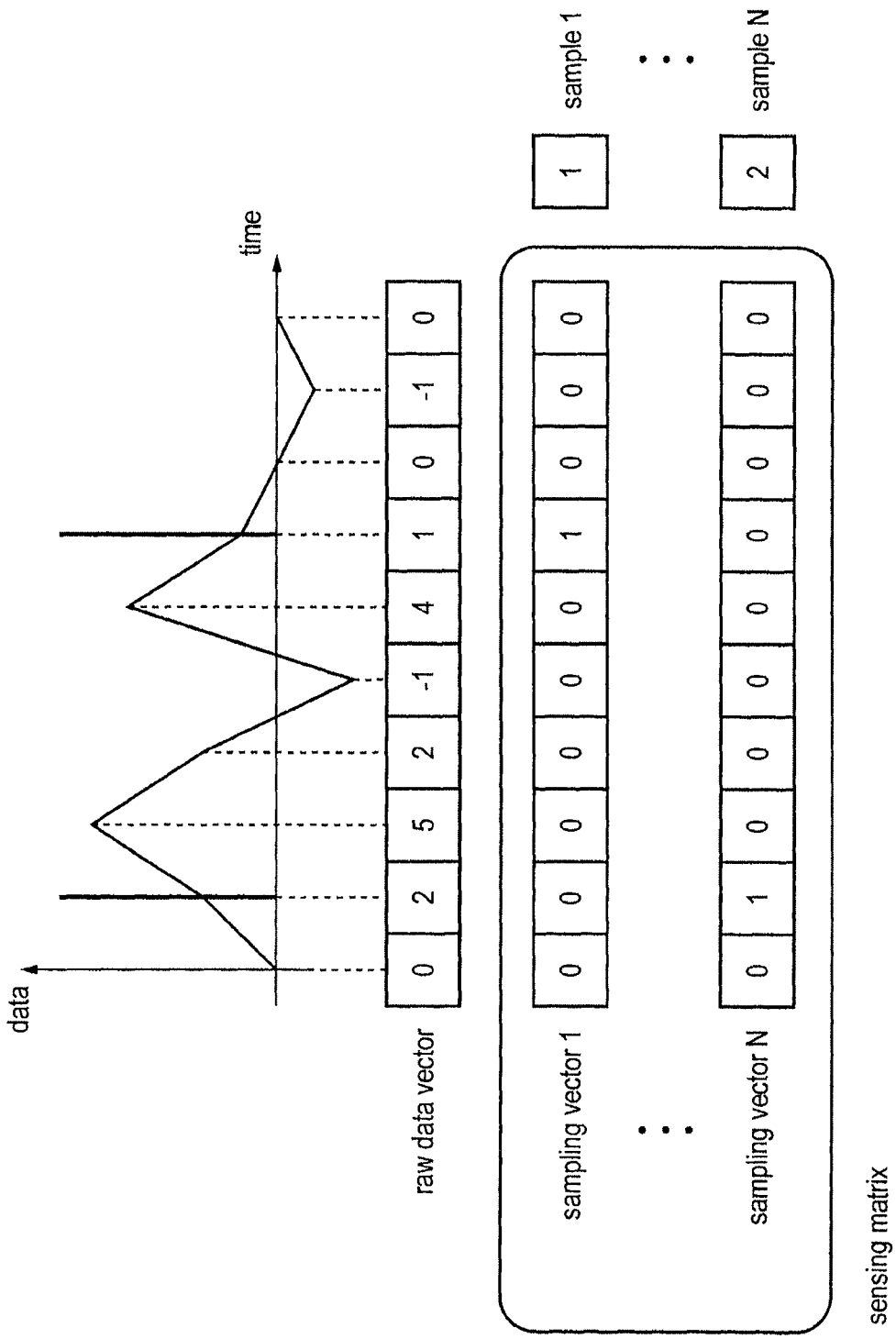

For a better understanding of various examples that are useful for understanding the detailed description, reference will now be made by way of example only to the accompanying drawings in which:

FIG. 1 illustrates a system;
FIG. 2 illustrates a sensor;
FIG. 3 illustrates an apparatus;
FIG. 4 illustrates an apparatus;
FIG. 5 illustrates an apparatus;
FIG. 6 illustrates a method; and
FIG. 7 illustrates an example of a sampling process.

DETAILED DESCRIPTION

The Figures illustrate a system 10. The system 10 comprises at least one sensor 11 and at least one apparatus 13/15.

The apparatus 13/15 may comprise at least one processor 55; and at least one memory 57 including computer program code 61; the at least one memory 57 and the computer program code 61 configured to, with the at least one processor 55, cause the apparatus 13/15 at least to perform: receiving a data signal from at least one sensor 11; determining a quality of the received data signal; and if the quality of the received data signal is within a first threshold providing a feedback signal to control the sampling basis of the sensor 11.

The sensor 11 may comprise at least one processor 31; and at least one memory 33 including computer program code 37; the at least one memory 33 and the computer program code 37 configured to, with the at least one processor 31, cause the sensor 11 at least to perform; compressing a sensor data signal using a sampling basis to obtain a compressed data signal; and in response to a first feedback signal changing a sampling basis used to obtain the compressed data signal.

FIG. 1 illustrates a system. The example system of FIG. 1 comprises a plurality of sensors 11, a mobile apparatus 13 and a remote apparatus 15.

In the example system 10 of FIG. 1 three sensors 11 have been illustrated. It is to be appreciated that in other examples any number of sensors 11 could be provided. Also in the example system of FIG. 10 only one mobile apparatus 13 and only one remote apparatus 15 have been illustrated. It is to be appreciated that in other examples there may be more than one mobile apparatus 13 and more than one remote apparatus 15. In some examples the apparatus 13/15 may be part of more than one system 10.

The sensors 11 may be configured to sense parameters and obtain a sensor data signal indicative of the sensed parameters. In some examples each sensor 11 within the system 10 may be configured to sense a different parameter. In other examples two or more of the sensors 11 may be configured to sense the same parameter but may be located in different locations so that different measurements may be made.

The mobile apparatus 13 may be a hand-held apparatus such as a mobile cellular telephone or tablet computer or any other suitable type of apparatus.

In the example system 10 of FIG. 1 the sensors 11 are located remotely from the mobile apparatus 13. The mobile apparatus 13 and the sensors 11 may form a local communications network. The system 10 may comprise a plurality of communication links 17 between the mobile apparatus 13 and the plurality of sensors 11. The communication links 17 may comprise any means which may enable data to be exchanged between the mobile apparatus 13 and the sensors 11. The communication link 17 may enable data obtained by the sensor 11 to be transmitted from the sensor 11 to the mobile apparatus 13. The communication link 17 may enable control signals to be provided to the sensors 11 from the mobile apparatus 13.

The communication link 17 may comprise a wireless communication link. The wireless communication link 17 may comprise for example, Bluetooth connection, Bluetooth low energy, Wi-Fi, infrared, near field communication or any other suitable type of communication link.

It is to be appreciated that in some examples one or more of the sensors 11 could be part of the mobile apparatus 13 or may be physically coupled to the mobile apparatus 13. For example one of the sensors 11 may comprise a camera module which may be part of a mobile apparatus 13 such as a cellular telephone. In such examples the communication link 17 between the sensor 11 and the mobile apparatus 13 may comprise a physical or wired connection.

The mobile apparatus 13 may be configured to obtain a data signal from the sensors 11 and relay the data signal to the remote apparatus 15. The mobile apparatus 13 may also be configured to obtain a control or feedback signal from the remote apparatus 15 and provide this to the sensors 11.

The remote apparatus 15 may comprise, as an example, a server. The remote apparatus 15 may be located remotely from the sensors 11 and/or the mobile apparatus 13.

The remote apparatus 15 may be configured to communicate with the mobile apparatus 13 via a communication link 19. The communication link 19 may comprise any means which may enable data to be exchanged between the mobile apparatus 13 and the remote apparatus 15. The communication link 19 may comprise, for example, an internet connection or a cellular communication network or any other suitable communications link.

In some examples the system 10 may comprise communication link 20 between one or more of the sensors 11 and the remote apparatus 15. This may enable data to be exchanged directly between the sensor 11 and the remote apparatus 15.

The example system 10 of FIG. 1 may be used to enable a large amount of information to be obtained by the sensors 11 and provided to the mobile apparatus 13 and/or the remote apparatus 15. The information obtained by the sensors 11 may be used for any suitable purpose. For instance the outputs provided by the apparatus 13/15 may be modified in response to an analysis of the information obtained by the sensors 11. In such examples, the information obtained by the sensors 11 may be used to determine a context of the user of a mobile apparatus 13. The outputs provided by the mobile apparatus 13 may then be configured to correspond to the determined context. For example, information displayed on a display may comprise text or images such as advertisements considered to be relevant to the determined context.

The efficiency of the system 10 may be improved by compressing a sensed data signal before it is transmitted by the sensor 11. This may reduce the power and bandwidth needed to transmit the data signal. The sensed data signal may be compressed using any suitable system such as compressive sampling.

Compressive sampling is a method in which a sensed data signal is sampled and simultaneously compressed at a greatly reduced rate. Compressive sampling may enable a sensor 11 to efficiently capture the information in a sparse signal. Numerical optimization may be used by the apparatus 13/15 to reconstruct the full length signal.

A sparse signal is one where a few coefficients of a data signal capture most of the information. The small coefficients of the data signal may be discarded without losing much information.

In order to use compressive sampling it is necessary to find a basis in which the data signal can be assumed to be sparse and then find a corresponding incoherent basis in which the sampling can be made.

FIG. 2 illustrates a sensor 11. The example sensor 11 of FIG. 2 may be used in a system 10 such as the example system 10 of FIG. 1. The example sensor 11 comprises a sensing portion 21, at least one transmitter and/or receiver 23 and a controller 25.

The sensing portion 21 may comprise any means which may be configured to sense a parameter and provide a sensor data signal indicative of the sensed parameter. The sensing portion which is used may be dependent on the parameter which is to be sensed. Different sensors 11 may be used to sense different parameters and so different sensors 11 may have different types of sensing portions.

The sensor data signal which is obtained by the sensing portion 21 may be represented as an N-dimensional vector $x=[x_1, x_2 \ldots x_N]$. The value of N may depend upon factors such as the parameter which is being sensed.

The sensing portion 21 may comprise, for example, an image sensor such as a camera, a micro-electromechanical system (MEMS) such as an accelerometer, magnetometer, gyroscope, barometer or any other suitable means. In some examples the sensing portion 21 may comprise a thermometer, a bio-sensor, a chemical sensor, radiation sensor, a heart rate meter, light sensor or microphone.

The parameters which are sensed by the sensing portion 21 may comprise environmental parameters which may relate to the environment in which the sensor 11 is positioned. For example the environmental parameters may comprise parameters such as temperature, light, humidity, biological or chemical molecules or any other suitable parameters. In some examples, the parameters which are sensed by the sensing portion 21 may comprise parameters relating to the physiological properties of a person. Such parameters may comprise the conductivity of the person's skin, the temperature of the person's skin, the humidity of the person's skin or any other property such as the pH of the skin or sweat.

It is to be appreciated that a single sensor 11 may comprise more than one different sensing portion 21 and so a single sensor 11 may simultaneously sense a plurality of different parameters.

The sensor 11 may be configured to provide the sensor data signal to the controller 25. The controller 25 may comprise any means which may be used to control the sensor 11. The controller 25 may be programmable. The controller may be configured to be controlled by a signal received from another apparatus 13/15 in the system 10. The controller 25 may comprise any means which may be configured to compress the sensor data signal to obtain a compressed data signal. The controller may be configured to provide the compressed data signal to the transmitter/receiver 23 to enable the compressed data signal to be transmitted to an apparatus 13/15.

The controller 25 may be configured to perform a sampling process on the sensed data vector x which is obtained from the sensing portion 21. The sampled data $y=[y_1, y_2 \ldots y_M]$ may be obtained by multiplying the sensed data vector x by the matrix A where A is a sampling matrix such that $y=A.x$. The sensing matrix may be freely programmable. A control and/or feedback signal may be provided by an apparatus 13/15 as described below to program the sensing matrix. This may enable the sampling to be adapted to improve the performance of the system.

In some examples the sampling may be performed by explicitly multiplying a sensed data vector x with the sampling matrix in a digital form. In other examples this may be achieved by using analog amplification and integration with subsequent analog to digital conversion.

The controller 25 may be implemented using instructions that enable hardware functionality, for example, by using executable computer program instructions 37 in one or more general-purpose or special-purpose processors 31. The executable computer program instructions 37 may be stored on a computer readable storage medium (e.g. memory etc.) to be executed by such processors 31.

The controller 25 may also be configured: to compress a sensor data signal using a sampling basis to obtain a compressed data signal; and in response to a first feedback signal change a sampling basis used to obtain the compressed data signal; and in response to a second feedback signal change a sampling density of the sampling basis used to obtain the compressed data signal. The feedback signal may be received from another apparatus 13/15 within the system 10. The another apparatus 13/15 may be remote from the sensor 11.

The at least one processor 31 may be configured to read from and write to the at least one memory 33. The at least one processor 31 may also comprise an output interface via which data and/or commands are output by the at least one processor 31 and an input interface via which data and/or commands are input to the at least one processor 31.

The memory 33 may be configured to store a computer program 35 comprising computer program instructions (computer program code) 37 that controls the operation of the sensor 11 when loaded into the at least one processor 31. The computer program instructions 37, of the computer program 35, may provide the logic and routines that enable the sensor 11 to perform the relevant blocks of the methods described below, with reference to FIG. 6. The at least one processor 31 by reading the memory 33 is able to load and execute the computer program 35.

The sensor 11 therefore comprises: at least one processor 31; and at least one memory 33 including computer program code 37; the at least one memory 33 and the computer program code 37 configured to, with the at least one processor 31, cause the sensor 11 at least to perform: compressing a sensor data signal using a sampling basis to obtain a compressed data signal; and in response to a first feedback signal changing a sampling basis used to obtain the compressed data signal.

The transmitter/receiver 23 may comprise any means which enables a sensor data signal and/or a compressed data signal to be transmitted from the sensor 11 to an apparatus 13/15. The transmitter/receiver 23 may also comprise any means which enables a control and/or feedback signal to be received by the sensor 11 from the apparatus 13/15. The control and/or feedback signal may be provided to the controller 25 to enable the compression of the sensor data signal to be controlled by the apparatus 13/15.

It is to be appreciated that the sensor 11 may comprise additional features that are not illustrated in FIG. 2. For example the sensor 11 may comprise a power source such as a battery. In other examples the sensor 11 may be reflective or passive so may be operable without a local power source.

Also in some examples the sensor 11 may be configured to be worn by a user. In such examples the sensor 11 may comprise means for enabling the sensor 11 to be attached to the user. For example the sensor 11 may comprise a strap which enables the sensor to be attached to a part of the user's body such as their wrist or head.

In other examples the sensor 11 may be configured to be connected to another apparatus such as a car or an item of sports equipment. In such examples the sensor 11 may comprise means for connecting the sensor 11 to the another apparatus. In some examples the sensor 11 may be configured to be mounted on a wall or an item of furniture such as a table.

FIG. 3 illustrates an apparatus 41 according to another example of the disclosure. The apparatus 41 illustrated in FIG. 3 may be a chip or a chip-set. The apparatus 41 comprises at least one processor 31 and at least one memory 33 as described above in relation to FIG. 2. The apparatus 41 may be configured to be arranged within a sensor 11.

FIG. 4 illustrates an apparatus 13/15 which may be part of a system 10. The apparatus 13/15 may be configured to analyse a data signal provided by one or more sensors 11 and provide a feedback signal to control the sensors 11. The apparatus 13/15 may be configured to reconstruct a sensor data signal from a compressed data signal. The apparatus 13/15 may be a remote apparatus 15. In some examples the apparatus may be a mobile apparatus 13.

The apparatus 13/15 comprises at least one transmitter and/or receiver 51 and a controller 53. It is to be appreciated that only the features necessary for the following description are illustrated in FIG. 4. The apparatus 13/15 may comprise additional features such as user interfaces or any other suitable features.

The transmitter/receiver 51 may comprise any means which enables a sensor data signal and/or a compressed data signal to be received by the apparatus 13/15. In some examples the data signal may be received directly from the sensor 11. In other examples the data signal may be relayed to the apparatus 13/15 by an intermediary. For example, where the apparatus 13/15 is a remote apparatus 15 the data signal may be relayed to the apparatus by a mobile apparatus 13.

The transmitter/receiver 51 may also comprise any means which enables a control and/or feedback signal to be transmitted to the sensor 11 from the apparatus 13/15. The control and/or feedback signal may be provided directly to the sensor 11 from the apparatus 13/15. In other examples the control and/or feedback signal may be relayed to the sensor 11 via an intermediary. For example, where the apparatus 13/15 is a remote apparatus 15 the control or feedback signal may be relayed to the sensor 11 by a mobile apparatus 13.

The controller 53 may comprise any means which may be used to process a received data signal. The controller 53 may comprise means for decompressing a compressed data signal to obtain the original sensor data signal. The controller 53 may also comprise means for determining a quality of the data signal and providing feedback signals to the sensor 11 based on the determined quality.

The controller 53 provides means for controlling the apparatus 13/15. The controller 53 may be implemented using instructions that enable hardware functionality, for example, by using executable computer program instructions 61 in one or more general-purpose or special-purpose processors 55 that may be stored on a computer readable storage medium (e.g. memory etc.) to be executed by such processors 55.

The controller 53 may also be configured to receive a data signal from at least one sensor 11; determine a quality of the received data signal; and if the quality of the received data signal is within a first threshold provide a feedback signal to control the sampling basis of the sensor.

The at least one processor 55 may be configured to read from and write to the at least one memory 57. The at least one processor 55 may also comprise an output interface via which data and/or commands are output by the at least one processor 55 and an input interface via which data and/or commands are input to the at least one processor 55.

The memory 57 may be configured to store a computer program 59 comprising computer program instructions (computer program code) 61 that controls the operation of the apparatus 13/15 when loaded into the at least one processor 55. The computer program instructions 61, of the computer program 59, may provide the logic and routines that enable the apparatus 13/15 to perform the methods described below, with reference to FIG. 6. The at least one processor 55 by reading the memory 57 is able to load and execute the computer program 59.

The apparatus 13/15 therefore comprises: at least one processor 55; and at least one memory 57 including computer program code 61; the at least one memory 57 and the computer program code 61 configured to, with the at least one processor 55, cause the apparatus 13/15 at least to perform: receiving a data signal from at least one sensor 11; determining a quality of the received data signal; and if the quality of the received data signal is within a first threshold providing a feedback signal to control the sampling basis of the sensor 11.

FIG. 5 illustrates an apparatus 71 according to another example of the disclosure. The apparatus 71 illustrated in FIG. 5 may be a chip or a chip-set. The apparatus 71 comprises at least one processor 55 and at least one memory 57 as described above in relation to FIG. 4. The apparatus 71 may be configured to be arranged within an apparatus 13/15.

FIG. 6 illustrates a method. The method comprises blocks which may be carried out by a sensor 11 and blocks which may be carried out by an apparatus 13/15. The sensors 11 and apparatus 13/15 may be as described above in relation to FIGS. 2 to 5 and may be arranged in a system 10 as described above in relation to FIG. 1.

In some examples the apparatus 13/15 which performs the blocks of the method of FIG. 6 may be a remote apparatus 15. In such examples the remote apparatus 15 may communicate with the sensors 11 via a direct communication link or via a mobile apparatus 13. In other examples the apparatus 13/15 which performs the block of the method of FIG. 6 may be a mobile apparatus 13. In such examples the mobile apparatus 13 may communicate with the sensors 11 via a direct communication link. In such examples the mobile apparatus 13 may be configured to communicate with a remote apparatus 15 to enable data to be stored or updates to be received or any other suitable function.

In the example method of FIG. 6 blocks 101, 103, 115 and 117 may be carried out by a sensor 11. Blocks 105, 107, 109, 111, 113, 119, 121, 123 and 125 may be carried out by an apparatus 13/15.

At block 101 the properties of a sensor data signal obtained by the sensor 11 are determined. In some examples the properties of the sensor data signal may be determined by controlling the sensor 11 to sample a sensor data signal with the highest available sampling density. The high density data signal obtained by sampling with the highest available sampling density may have a large bandwidth and may extend over one or more frames.

At block 103 the high density data signal is transmitted by the sensor 11 to the apparatus 13/15. As mentioned above, in some examples, the data signal may be sent directly to the apparatus 13/15. In other examples the data signal may be sent to the apparatus 13/15 via an intermediary such as a mobile apparatus 13.

At block 105 the apparatus 13/15 determines a sparse basis B. The sparse basis B may be determined using information obtained from the sensor 11. The sparse basis B may be determined using the high density data signal.

In some examples the sparse basis B may be guessed or estimated. In such examples blocks 101 and 103 may be omitted and the sparse basis B may be chosen as a best guess.

In examples where the data signal is a time series signal, the sparse basis B used may be a Fourier basis. In examples where the data signal comprises image data, a typical sparse basis B may be a wavelet basis. In some examples the sparse basis B may be determined using algorithms such as feature learning algorithms.

Once the sparse basis B has been determined then, at block 107, a sampling basis A is determined. The sampling basis A may be incoherent with the sparse basis B which was determined at block 105. For example, if the chosen sparse basis B is the Fourier basis then a corresponding sampling basis A may be the Dirac delta basis. As another example, if the chosen sparse basis B is the wavelet basis then a corresponding sampling basis A may be a noiselet basis. In other examples random noise may be used as an incoherent sampling basis A.

At block 109 a quality of the received high density signal is determined. The quality of the signal may be the sparsity of the signal in the sparse basis B.

If the data signal is determined not to be sparse then a different sparse basis B and corresponding sampling basis A may need to be used. A data signal may be determined not to be sparse if the sparsity of the signal is within a first threshold. If the sparsity of the signal is within a first threshold then the method returns to block 105 and a different sparse basis B is determined.

Blocks 105 to 109 may be repeated until it is determined that the data signal is sparse in the sparse basis B. Blocks 105 to 109 may be repeated until the quality of the signal determined at block 109 is no longer within the first threshold.

At block 111 a feedback signal is sent to the sensor 11. The feedback signal may comprise information indicative of the sampling basis A. The feedback signal may enable the apparatus 13/15 to control the sampling basis A used by the sensor.

In some examples the sampling basis may contain more basis vectors than is essential to reconstruct the sensed data signal to allow for adjustments in the sampling density.

At block 113 the apparatus 13/15 may use the feedback signal to program the sensor 11 to compress sensor data signals using the sampling basis A determined at block 107. The sensor 11 may be programmed on how many samples to take in accordance with the determined sparsity of the signal.

The appropriate number of samples may be given by $M=\mu*S*\log N$ where $\mu$ is the coherence between the sparse basis B and the sampling basis A, S is the number of sparse elements in the data signal and N is the length of the frame of the sensor data signal.

Once the sensor 11 has been programmed then, at block 115, the sensor 11 uses the sampling basis A to obtain the compressed data signal y.

In some examples the sensor 11 may obtain the compressed data signal y by digitising the sensor data signal x and storing the digitised sensor data signal in a buffer. Once the buffer is full or the desired frame length has been obtained then the sensor data signal is multiplied with the M vectors of the sampling basis A to obtain the compressed data signal y.

In some examples where the sampling basis A is a random time basis then the compressed data signal y may be obtained by activating an analog/digital converter at M random times as prescribed by the feedback signal provided by the apparatus 13/15.

In other examples other algorithms may be used to obtain the compressed data signal, for example if the sampling basis is random noise then a random multiplication preintegration (RMPI) may be used for the sampling.

At block 117 the compressed data signal y is transmitted from the sensor 11 to the apparatus 13/15. As the data signal y has been compressed this may reduce the power and bandwidth necessary to transmit the information obtained by the sensor 11 to the apparatus 13/15. However if the compressive sampling has been used effectively very little information will have been lost in the compression.

At block 119 the compressed data signal is received by the apparatus 13/15. The compressed data signal y may be stored in the memory 57 of the apparatus 13/15 for later reconstruction.

At block 121 the sensor data signal x is obtained from the compressed data signal y. Any suitable method for decompressing the compressed data signal y to obtain sensor data signal x may be used.

For example the original data may be recovered by minimising the $L^1$ norm of z under the constraint A.B.z=y provided that the following conditions are satisfied.

1) The sampling basis and the sparse basis are incoherent. That is, $a_k.b_j<N^{-1/2}$ where $a_k$ and $b_j$ are rows of the matrices A and B.

2) The number of samples is of the order 4k where k is the number of non-zero (or significantly far from zero) elements in z.

At block 123 a quality of the reconstructed signal is determined. The quality of the reconstructed signal may be determined by measuring the sparsity of the reconstructed signal. The sparsity of the reconstructed signal can be defined as the number of elements of $u_k$=abs($z_k$)/max(k,abs($z_k$)) that are larger than a certain value where z is the reconstructed signal in the sparse basis. The value may be dependent on the data which is being obtained. The value may be much less than 1.

At block 125 the quality of the reconstructed signal is compared to the quality of signals which have been obtained and reconstructed previously.

If there is no significant change in the quality of the signal then the sampling basis remains unchanged.

If there is a significant change in the quality of the signal then the number of samples used may be changed. A significant change may be indicated by change in a quality of the signal, such as the sparsity of the signal, which falls within certain threshold.

If the change is a decrease in the sparsity of the signal then the apparatus 13/15 may determine that the number of samples M in the sampling basis A may be decreased. The method may return to block 113 to enable the sampling density to be decreased and a feedback signal may be sent to the sensor 11 to control the sampling density used by the sensor 11.

If the change is an increase in the sparsity of the signal then the apparatus 13/15 may determine that the number of samples used may be insufficient to capture all the information obtained in the sensed data signal x. The apparatus 13/15 may determine that the number of samples in the sampling basis A should be increased. The method may return to block 113 to enable the sampling density to be increased and a feedback signal to be sent to the sensor 11 to control the sampling density used by the sensor 11.

In some examples the method may return to block 101 at random times in order to ensure that a sparse basis is used at all times. The method may return to block 101 if it is determined that the signal is no longer sparse. For example if at block 125 it is determined that there has been a very big change in the quality of the signal the method may return to block 101 to enable a new sampling basis A to be determined.

The blocks illustrated in FIG. 6 may represent steps in a method and/or sections of code in the computer program 35, 59. The illustration of a particular order to the blocks does not necessarily imply that there is a required or preferred order for the blocks and the order and arrangement of the block may be varied. Furthermore, it may be possible for some blocks to be omitted.

FIG. 7 illustrates an example of a sampling process which may be used to obtain a compressed data signal from a sensed data signal. The raw data vector is multiplied by a plurality of sampling vectors. In this example N sampling vectors are used to obtain the samples 1 . . . N The computer programs 35/59 may arrive at the sensor 11 or apparatus 13/15 via any suitable delivery mechanism. The delivery mechanism may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 35/59 or any other suitable mechanism. The delivery mechanism may be a signal configured to reliably transfer the computer program 35/59. The sensor 11 or apparatus 13/15 may propagate or transmit the computer program 35/59 as a computer data signal.

Although the memories 33/57 are illustrated as a single component they may be implemented as one or more separate components some or all of which may be integrated/removable and/or may provide permanent/semi-permanent/dynamic/cached storage.

Although the processors 31/55 are illustrated as a single component they may be implemented as one or more separate components some or all of which may be integrated/removable.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' refers to all of the following:

(a) hardware-only circuit implementations (such as implementations in only analog and/or digital circuitry) and (b) combinations of circuits and software (and/or firmware), such as (as applicable): (i) a combination of processor(s) or (ii) portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

The examples described above provide the advantage that they enable the power and bandwidth required to transmit the information obtained by a plurality of sensors 11 from the sensors 11 to other apparatus 13/15 to be greatly reduced. The processing power and the power consumption at the sensor 11 may also be greatly reduced.

The use of the data analysis by the apparatus 13/15 enables feedback to be provided to the plurality of sensors 11 so that the sensors 11 can be programmed effectively. This also enables the system 10 to adapt to changes in the sensor 11 data.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this detailed description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some or all other examples. Thus 'example', 'for example' or 'may' refers to a particular instance in a class of examples. A property of the instance can be a property of only that instance or a property of the class or a property of a sub-class of the class that includes some but not all of the instances in the class.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
   receiving a data signal from at least one sensor;
   determining a quality of the received data signal, the determined quality being indicative of a sparsity of the received data signal in a sparse basis; and
   providing, in response to the quality of the received data signal being within a first threshold, a first feedback signal to control a sampling basis of the sensor, wherein being within the first threshold corresponds to the received data signal not being sparse in the sparse basis.

2. The method claimed in claim 1 further comprising:
   providing, in response to the quality of the received data signal being within a second threshold, a second feedback signal to control a sampling density of the sensor.

3. The method as claimed in claim 2, wherein the second threshold indicates that the sparsity of the received data signal has increased.

4. The method as claimed in claim 2, wherein the second threshold indicates that the sparsity of the received data signal has decreased.

5. An apparatus comprising:
   at least one processor; and
   at least one memory including computer program code;
   the at least one memory and the computer program code configured to, with the at least one processor, cause the apparatus to at least;
   receive a data signal from at least one sensor;
   determine a quality of the received data signal, the determined quality is a sparsity of the received data signal in a sparse basis; and
   provide, in response to the quality of the received data signal being within a first threshold, a first feedback signal to control the sampling basis of the sensor, wherein being within the first threshold corresponds to the received data signal not being sparse in the sparse basis.

6. A non-transitory computer-readable storage medium including program code which when executed by at least one processor, causes operations comprising:
   receiving a data signal from at least one sensor;
   determining a quality of the received data signal, the determined quality is a sparsity of the received data signal in a sparse basis; and
   providing, in response to the quality of the received data signal being within a first threshold, a first feedback signal to control a sampling basis of the sensor, wherein being within the first threshold corresponds to the received data signal not being sparse in the sparse basis.

7. A method comprising:
   compressing a sensor data signal using a sampling basis to obtain a compressed data signal; and
   changing, in response to a first feedback signal, the sampling basis used to obtain the compressed data signal, the first feedback signal indicating that a quality representative of a sparsity of the sensor data signal in a sparse basis is within a first threshold which is not sparse.

8. The method as claimed in claim 7 further comprising: changing, in response to a second feedback signal, a sampling density of the sampling basis used to obtain the compressed data signal.

9. The method as claimed in claim 7, wherein the first feedback signal and/or the second feedback signal is received from a remote apparatus.

10. The method as claimed in claim 7, further comprising: transmitting the compressed data signal to a remote apparatus.

11. The method as claimed in claim 7, wherein the first feedback signal and/or the second feedback signal is received in response to the transmission of the compressed data signal.

12. The method as claimed in claim 7, wherein the first feedback signal and/or the second feedback signal is received independently of the transmission of the compressed data signal.

13. An apparatus comprising:
   at least one processor; and
   at least one memory including computer program code;

the at least one memory and the computer program code configured to, with the at least one processor, cause the apparatus to at least:

compress a sensor data signal using a sampling basis to obtain a compressed data signal; and change, in response to a first feedback signal, the sampling basis used to obtain the compressed data signal, the first feedback signal indicating that a quality representative of a sparsity of the sensor data signal in a sparse basis is within a first threshold which is not sparse.

14. A non-transitory computer-readable storage medium including program code which, when executed by at least one processor, causes operations comprising:

compressing a sensor data signal using a sampling basis to obtain a compressed data signal; and changing, in response to a first feedback signal, the sampling basis used to obtain the compressed data signal, the first feedback signal indicating that a quality representative of a sparsity of the sensor data signal in a sparse basis is within a first threshold which is not sparse.

15. A system comprising:
at least one sensor; and
at least one control apparatus, wherein the at least one sensor comprises: at least one processor; and at least one memory including computer program code, the at least one memory and the computer program code configured to, with the at least one processor, cause the at least one sensor at least to:

compress a sensor data signal using a sampling basis to obtain a compressed data signal, and change, in response to a first feedback signal, the sampling basis used to obtain the compressed data signal, the first feedback signal indicating that a quality representative of a sparsity of the sensor data signal in a sparse basis is within a first threshold which is not sparse; and wherein the control apparatus comprises: at least one processor; and at least one memory including computer program code, the at least one memory and the computer program code configured to, with the at least one processor, cause the control apparatus at least to:

receive the data signal from the at least one sensor, determine a quality of the received data signal, and provide, if the quality of the received data signal is within the first threshold, the first feedback signal to control the sampling basis of the sensor.

* * * * *